United States Patent [19]

Yano et al.

[11] Patent Number: 5,977,808
[45] Date of Patent: Nov. 2, 1999

[54] LATCH CIRCUIT AND ARITHMETIC UNIT HAVING THE SAME

[75] Inventors: Naoka Yano; Hiroaki Murakami, both of Tokyo; Yukinori Muroya, Tokoy, all of Japan

[73] Assignee: Kabushiki Kaisha Toshiba, Kawasaki, Japan

[21] Appl. No.: 08/909,949

[22] Filed: Aug. 12, 1997

[30] Foreign Application Priority Data

Aug. 12, 1996 [JP] Japan ..................................... 8-212742

[51] Int. Cl.[6] .................................................... H03K 3/356
[52] U.S. Cl. ........................... 327/218; 327/200; 327/201
[58] Field of Search .................................. 327/197–203, 327/208–212, 214, 215, 218

[56] References Cited

U.S. PATENT DOCUMENTS 5,638,018   6/1997   Sharpe-Geisler ........................ 327/215
5,825,225  10/1998   Sugisawa et al. ...................... 327/208

FOREIGN PATENT DOCUMENTS 6-260901   9/1994   Japan ..................................... 327/202

OTHER PUBLICATIONS

"FET Gated Data Latch Circuit" by Wong, IBM technical disclosure bulletin, vol. 24, No. 6, Nov. 1981.

"Fast Propogation Complementary Metal Oxide Semiconductor LSSD Latch", IBM technical disclosure bulletin, vol. 37, No. 10, Oct. 1994.

*Primary Examiner*—Tuan T. Lam
*Attorney, Agent, or Firm*—Foley & Lardner

[57] ABSTRACT

A latch circuit receives complementary signals and consists of an nMOS transistor whose source is connected to an input terminal of the latch circuit and a series-connected circuit consisting of first and second pMOS transistors arranged between and connected to a drain terminal of the nMOS transistor and a high-potential power supply. The complementary signals are a first signal and a second signal that is an inversion of the first signal. Each of the signals has a pulse characteristic that rising time is longer than falling time. The latch circuit latches a quick fall by passing the first signal through the nMOS transistor. On the other hand, the latch circuit latches a slow rise by turning on the second pMOS transistor in response to a fall in the second signal.

23 Claims, 11 Drawing Sheets

5,977,808

LATCH CIRCUIT AND ARITHMETIC UNIT HAVING THE SAME

BACKGROUND OF THE INVENTION

1. Field of the Invention

The present invention relates to a latch circuit for latching complementary signals that rise and fall oppositely to each other and an arithmetic unit employing the latch circuit.

2. Description of the Prior Art

FIG. 1 shows a latch circuit employing clock-controlled inverters according to a prior art, and FIG. 2 shows a latch circuit employing CMOS transmission gates according to another prior art.

In FIG. 1, the latch circuit consists of a clock-controlled inverter 11, an inverter 12, a clock-inverter 13, and an inverter 14. The inverter 11 is connected to an input terminal D. The inverter 12 has an input terminal connected to an output terminal of the inverter 11. The inverter 13 has an input terminal connected to an output terminal of the inverter 12 and an output terminal connected to the output terminal of the inverter 11. The inverter 14 has an input terminal connected to the output terminals of the inverters 11 and 13. The inverter 11 inverts and transmits an input signal when a clock signal φ is low level and an inverted clock signal φ̄ is high level. The inverted clock signal φ̄ is an inversion of the clock signal φ.

The clock-controlled inverter 13 inverts and transmits the output of the inverter 12 when the clock signal φ is high level and the inverted clock signal φ̄ is low level.

In FIG. 2, the latch circuit consists of CMOS transmission gates 25 and 28 and inverters 12, 14, and 27. The gate 25 is connected to an input terminal D. The inverter 12 has an input terminal connected to an output terminal of the transmission gate 25. The inverter 27 has an input terminal connected to an output terminal of the inverter 12. The transmission gate 28 has an input terminal connected to an output terminal of the inverter 27 and an output terminal connected to the output terminal of the transmission gate 25. The inverter 14 has an input terminal connected to the output terminals of the transmission gates 25 and 28. The transmission gate 25 transmits an input signal when a clock signal φ is low level and an inverted clock signal φ̄ is high level. The transmission gate 28 transmits a signal when the clock signal φ is high level and the inverted clock signal φ̄ is low level.

In the latch circuit shown in FIG. 1, the clock-controlled inverter 11 arranged in a first stage becomes conductive if the clock signal φ is low level and the inverted clock signal φ̄ is high level, to fetch an input signal supplied to the input terminal D and transfer the same to an output terminal Q. In the latch circuit shown in FIG. 2, the CMOS transmission gate 25 arranged in a first stage becomes conductive if the clock signal φ is low level and the inverted clock signal φ̄ is high level, to fetch an input signal supplied to the input terminal D and transfer the inverted signal D̄ to an output terminal Q. Thereafter, when the clock signal φ changes to high level and the inverted clock signal φ̄ to low level, the inverter 11 or the transmission gate 25 is turned off, while closing a circuit for holding the current output, i.e., the fetched input signal, which is, therefore, not affected by any change in an input signal. The current output is held as it is until the clock signal φ again changes to low level and the inverted clock signal φ̄ to high level.

These latch circuits may receive, for example, output signals of a selector circuit of FIG. 3. The selector circuit has input terminals D1 and D2 for receiving input signals D1 and D2 and input terminals D̄1 and D̄2 for receiving inverted input signals D̄1 and D̄2. The selector circuit consists of nMOS transmission gates 31 to 34. The transmission gate 31 has a source terminal connected to the input terminal D1 and a gate terminal to receive a control signal A. The transmission gate 32 has a source terminal connected to the input terminal D2, a gate terminal to receive an inverted control signal Ā, which is an inversion of the control signal A, and a drain terminal connected to a drain terminal of the gate 31. The transmission gate 33 has a source terminal connected to the input terminal D̄1 and a gate terminal to receive the control signal A. The transmission gate 34 has a source terminal connected to the input terminal D̄2, a gate terminal to receive the inverted control signal Ā, and a drain terminal connected to a drain terminal of the gate 33. The selector circuit further has pMOS transistors 35 and 36. The transistor 35 has a gate terminal connected to the drain terminals of the transmission gates 33 and 34, a source terminal connected to a power supply for supplying a high level potential, and a drain terminal connected to an output terminal OUT. The transistor 36 has a gate terminal connected to the drain terminals of the transmission gates 31 and 32, a source terminal connected to the power supply, and a drain terminal connected to an output terminal $\overline{\text{OUT}}$. The output terminal $\overline{\text{OUT}}$ provides a signal which is an inversion of an output signal provided by the output terminal OUT.

The operation of the selector circuit of FIG. 3 will be explained. If the control signal A is high level and the inverted control signal Ā is low level, the transmission gates 31 and 33 are conductive, and the transmission gates 32 and 34 are in the OFF state. As a result, the input terminals D2 and D̄2 are disconnected from the output terminals OUT and $\overline{\text{OUT}}$ and become irrelevant to them. Under this state, if the input terminal D1 is high level, the drain terminal of the transmission gate 31 provides a signal which is equal to the high level potential minus the gate threshold voltage Vth thereof. On the other hand, the input terminal D̄1 is low level, and therefore, the drain terminal of the transmission gate 33 quickly transmits the low level signal to the output terminal $\overline{\text{OUT}}$. When the output terminal $\overline{\text{OUT}}$ becomes low level, the transistor 35 becomes conductive, to connect the drain terminal of the gate 31, i.e., the output terminal OUT to the power supply. As a result, the output terminal OUT receives the high level potential of the power supply compensating voltage drop due to the gate threshold voltage Vth.

If the input terminal D1 is low level, the input terminal D̄1 is high level, to achieve an operation opposite to the one mentioned above. Namely, the drain terminal of the transmission gate 31 quickly transmits the low level signal to the output terminal OUT, and the transmission gate 33 transmits a signal equal to the high level minus the gate threshold voltage Vth. The output terminal OUT is low level to turn on the transistor 36 to connect the power supply to the output terminal $\overline{\text{OUT}}$. As a result, the output terminal $\overline{\text{OUT}}$ correctly provides the high level potential compensating the voltage drop due to the gate threshold voltage Vth.

If the control signal A is low level and the inverted control signal Ā is high level, the transmission gates 32 and 34 become conductive contrary to the above-mentioned case, and the pMOS transistors 35 and 36 help to provide a high-level output.

In the above operation, the high level is accomplished with aids of the transistor 35 or 36, while the low level is transmitted directly to any one of the output terminals OUT and $\overline{\text{OUT}}$. Hence the transition to low level is always faster than the transition to the high level. Namely, as shown in the timing chart of FIG. 4, the completion of a rise in the output OUT is always behind the completion of a corresponding fall in the output $\overline{\text{OUT}}$, and the completion of a rise in the output $\overline{\text{OUT}}$ is always behind the completion of a corresponding fall in the output OUT.

As explained above, the selector circuit of FIG. 3 provides complementary signals having the relationship of FIG. 4. It is usual that one of corresponding rise and fall in complementary output pulses is behind the other. If the output OUT of the complementary outputs of FIG. 4 is connected to the input terminal D of any one of the latch circuits of FIGS. 1 and 2, the latch circuit operates at high speed when the output OUT falls and slowly when the output OUT rises. To latch such signal having different rising time and falling time, the latch circuit must adjust itself to the slower timing. This hinders a high-speed latching operation even if the latch circuit is capable of speedily operating on one of the rise and fall of an input signal.

SUMMARY OF THE INVENTION

In view of these problems, an object of the present invention is to provide a latch circuit that operates at high speed on complementary signals.

Another object of the present invention is to provide a latch circuit capable of speedily latching complementary input signals whose rising time and falling time differ from each other.

Still another object of the present invention is to provide a latch circuit capable of statically holding latched data and stably operating at high speed.

Still another object of the present invention is to provide an arithmetic unit having a latch circuit that has a simple structure and operates at high speed.

In order to accomplish the objects, a first aspect of the present invention provides a latch circuit having a first transmission unit for controlling the transmission of a first input signal in synchronization with a first transmission control signal, a second transmission unit for controlling the transmission of predetermined potential in synchronization with a second transmission control signal, and a third transmission unit for controlling the transmission of the predetermined potential in synchronization with a second input signal. The second and third transmission units are connected in series to form a series-connected circuit. The series-connected circuit is arranged between a power supply of the predetermined potential and an output terminal of the first transmission unit. The order of the second and third transmission units in the series-connected circuit can be interchanged each other. Namely, the second transmission unit may connect to the power supply, and third transmission unit may connect to the output terminal of the first transmission gate, and vice versa. The first and second input signals are complementary signals that rise and fall oppositely to each other and have rising time and falling time that differ from each other. The latch circuit latches the first input signal at the output terminal of the first transmission unit. Preferably, the first transmission control signal may be a clock signal CLK, and the second transmission control signal may be an inverted clock signal $\overline{\text{CLK}}$, which is an inversion of the clock signal CLK.

The first aspect of the present invention provides a high-speed latching operation for both of positive and negative logic when latching an input signal whose rise is gentler than its fall. If a rise of the first input signal is supplied to the first transmission unit, the second input signal, which falls faster than the rise of the first input signal, turns on the third transmission unit, to start a latching operation before the completion of the rise of the first input signal. If a fall of the first input signal is supplied to the first transmission unit, the first transmission unit transmits the same as it is because the first input signal falls quicker than a corresponding rise of the second input signal. As a result, in each case, a latching operation starts before the completion of a slower rise in the input signal.

If a fall of the first input signal is gentler than a rise thereof, the third transmission unit is designed to turn on in response to a rise of the second input signal, so that a latching operation may start before the completion of a fall of the first input signal.

The latch circuit of the present invention may have a holding circuit connected to the output terminal of the first transmission unit, to statically hold the first input signal latched at the output terminal of the first transmission unit.

The latch circuit of the present invention may have a buffer circuit connected to the output terminal of the first transmission unit, to buffer and provide the first input signal latched at the output terminal of the first transmission unit.

More precisely, the latch circuit of the present invention consists of a first FET (Field Effect Transistor) of first conductivity type for controlling the transmission of a first input signal D in synchronization with a clock signal CLK, a second FET of second conductivity type for controlling the transmission of predetermined potential in synchronization with an inverted clock signal $\overline{\text{CLK}}$, which is an inversion of the clock signal CLK, and a third FET of the second conductivity type for controlling the transmission of the predetermined potential in synchronization with a second input signal $\overline{\text{D}}$. The second and third FETs are connected in series to form a series-connected circuit. The series-connected circuit is arranged between a power supply for supplying the predetermined potential and a drain terminal of the first FET. In the series-connected circuit, the order of the second and third FETs is interchangeable. The first and second input signals D and $\overline{\text{D}}$ rise and fall oppositely to each other and have different rising time and falling time. The drain terminal of the first FET latches the first input signal D.

If a rise of the first input signal D is slower than a fall thereof, the predetermined potential of the power supply is set to be a high level voltage, the first FET of the first conductivity type is an n-channel MOS transistor, and the second and third FETs of the second conductivity type are each a p-channel MOS transistor. On the other hand, if a fall of the first input signal D is slower than a rise thereof, the predetermined potential is set to be a low level voltage, the first FET is a p-channel MOS transistor, and the second and third FETs are each an n-channel MOS transistor.

The drain terminal, i.e., the output side of the first FET is connected to a holding circuit. The holding circuit may consist of an inverter connected to the drain terminal of the first FET and a clock-controlled inverter having an input terminal connected to an output of the inverter and output terminal connected to the drain terminal of the first FET. Or, the holding circuit may consist of a first inverter connected to the drain terminal of the first FET, a second inverter connected to an output terminal of the first inverter, and a transmission gate having an input terminal connected to an output terminal of the second inverter and an output terminal connected to the drain terminal of the first FET. For example, the clock-controlled inverter inverts and transmits a signal in synchronization with the clock signal CLK and inverted clock signal $\overline{\text{CLK}}$, and therefore, the holding circuit statically holds, in synchronization with the clock signal CLK, the first input signal D latched at the drain terminal of the first FET.

In this way, the latch circuit of the first aspect of the present invention receives the complementary first and second input signals (D, $\overline{D}$) involving different rising time and falling time and latches one of them in response to faster one of the rise and fall of the input signals. As a result, the latch circuit is capable of latching the input signals at high speed even if they have different pulse characteristics.

A second aspect of the present invention provides an arithmetic unit having latch circuits based on the first aspect of the present invention. The latch circuits are connected to, for example, full adders each providing complementary sum and carry outputs, to form a dual-rail, sum-of-products unit that operates at high speed.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

DETAILED DESCRIPTION OF THE EMBODIMENTS

Figure 1:
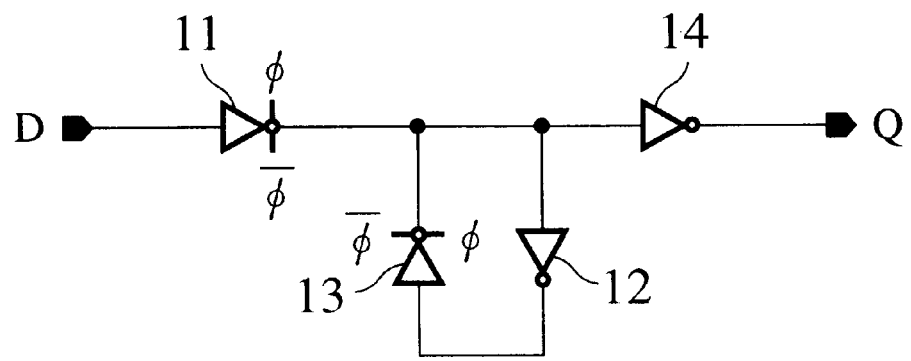
FIG. 1 shows a latch circuit employing clock-controlled inverters according to a prior art.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

Figure 4:
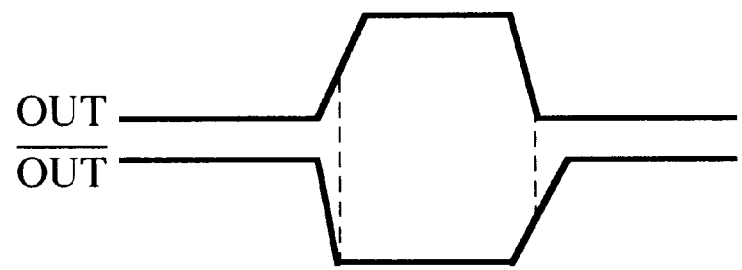
FIG. 4 shows signal waveforms supplied to a latch circuit of the present invention.
Figure 5A:
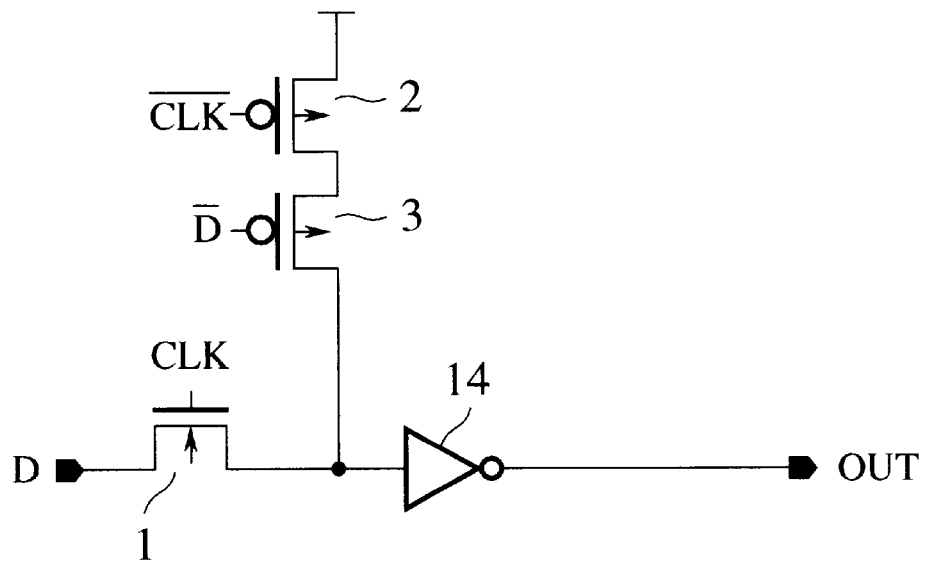
FIG. 5A shows a latch circuit according to a first embodiment of the present invention.

FIG. 5A shows a latch circuit according to the first embodiment of the present invention. The latch circuit has an nMOS transistor 1 and a series-connected circuit consisting of pMOS transistors 2 and 3. The nMOS transistor 1 serves as a first transmission unit and has a gate terminal to receive a clock signal CLK, a source terminal connected to an input terminal D, and a drain terminal, to control the transmission of input data D from the input terminal D to the drain terminal. The pMOS transistor 2 serves as a second transmission unit and has a gate terminal to receive an inverted clock signal $\overline{CLK}$, to control the transmission of high level potential from a power supply. The pMOS transistor 3 serves as a third transmission unit and has a gate terminal to receive inverted data $\overline{D}$ that is an inversion of the input data D, to control the transmission of the high level potential from the power supply. The latch circuit further has an inverter 14. The inverter 14 serves as a buffer circuit and has an input terminal connected to the drain terminal of the nMOS transistor 1 and an output terminal connected to an output terminal OUT of the latch circuit, to buffer and provide the input data D latched at the drain terminal of the nMOS transistor 1. The pMOS transistors 2 and 3 are connected in series to form the series-connected circuit. The series-connected circuit is arranged between the power supply for providing the high level potential and the drain terminal of the nMOS transistor 1. The input data D and $\overline{D}$ are complementary signals that rise and fall oppositely to each other and have different rising time and falling time as shown in FIG. 4. More precisely, the rising time of the input data D differs from the falling time of the input data $\overline{D}$. To latch the input data D, the nMOS transistor 1 and pMOS transistors 2 and 3 are sufficient and the inverter 14 may be omitted.

The operation of the latch circuit will be explained with complementary signals such as the outputs OUT and $\overline{OUT}$ of FIG. 4 being applied as the input data D and $\overline{D}$ to the latch circuit. If the clock signal CLK is high level, the nMOS transistor 1 becomes conductive to fetch the input data D. If the input data D changes from high to low level and the input data $\overline{D}$ from low to high level, the input data D falls quicker than the input data $\overline{D}$ rises. In response to the input data D that falls quickly, the drain terminal of the nMOS transistor 1 quickly becomes low level. The pMOS transistor 2 is conductive because the inverted clock signal $\overline{CLK}$ to the gate terminal thereof is low level. On the other hand, the pMOS transistor 3 is in the OFF state because the input data $\overline{D}$ to the gate terminal thereof is high level. As a result, the high-potential power supply is disconnected from the drain terminal of the nMOS transistor 1. Then, the latch circuit operates in response to only the input data D that changes speedily, to quickly pass the input data D.

If the input data D changes from low to high level and the input data $\overline{D}$ from high to low level, the drain terminal of the nMOS transistor 1 provides an output voltage equal to the high level minus the gate threshold voltage Vth thereof in response to the high-level input data D applied to the source terminal thereof. At this time, the pMOS transistor 2 is conductive, and the input data $\overline{D}$ applied to the gate terminal of the pMOS transistor 3 falls. The input data $\overline{D}$ changes faster than the input data D. And therefore, the pMOS transistor 3 becomes conductive to connect the drain terminal of the nMOS transistor 1 to the high-potential power supply so as to pull up the drain potential of the nMOS transistor 1.

Consequently, the latch circuit starts to operate in response to the input data $\overline{D}$ that changes first, without waiting for the completion of the change in the input data D, thereby improving a latching speed. The inverter 14 inverts the input data D, and the output terminal OUT provides the inverted data without regard to the level of the input data D.

If the clock signal CLK is low level, the nMOS transistor 1 is in the OFF state not to fetch the input data D. At this time, the inverted clock signal $\overline{CLK}$ is high level to turn off the pMOS transistor 2. Accordingly, the output terminal OUT dynamically holds the presently latched input data.

In this way, the first embodiment of the present invention is effective to speedily latch input data whose rise is gentler than its fall. Namely, when a rise of the input data D is received, the input data $\overline{D}$ that falls quickly makes the pMOS transistor 3 conductive to start a latching operation before the completion of the gentle rise of the input data D. When a steeper fall of the input data D is received, the nMOS transistor 1 transmits the input data D as it is. Accordingly, in any case, a latching operation starts without waiting for the completion of a slower rise of the input data D, to thereby improve the operation speed of the latch circuit.

Figure 5B:
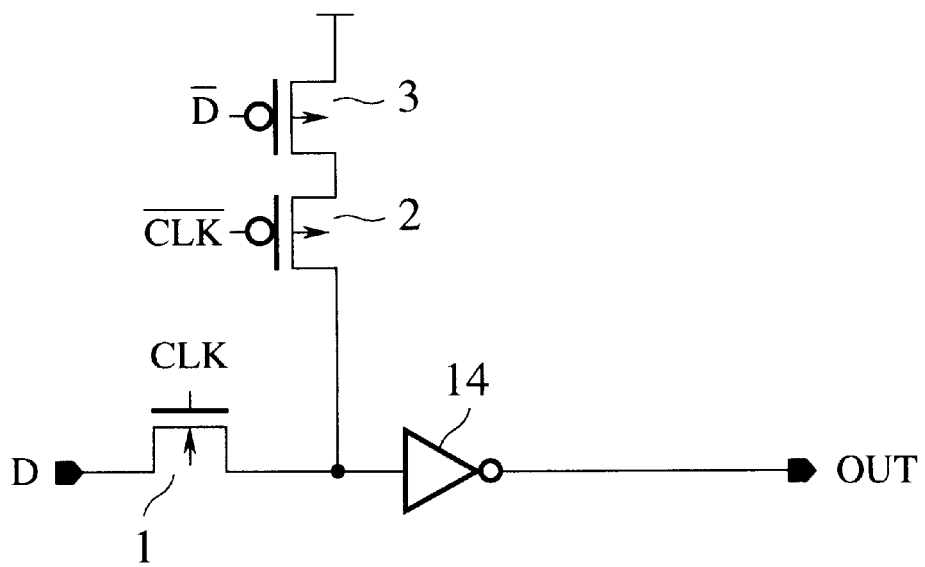
FIG. 5B shows a latch circuit according to a modification of the first embodiment of the present invention.

The order of the pMOS transistors 2 and 3 is interchangeable as shown in FIG. 5B, and the same function and effectiveness are obtained as explained above.

Second Embodiment

Figure 6A:
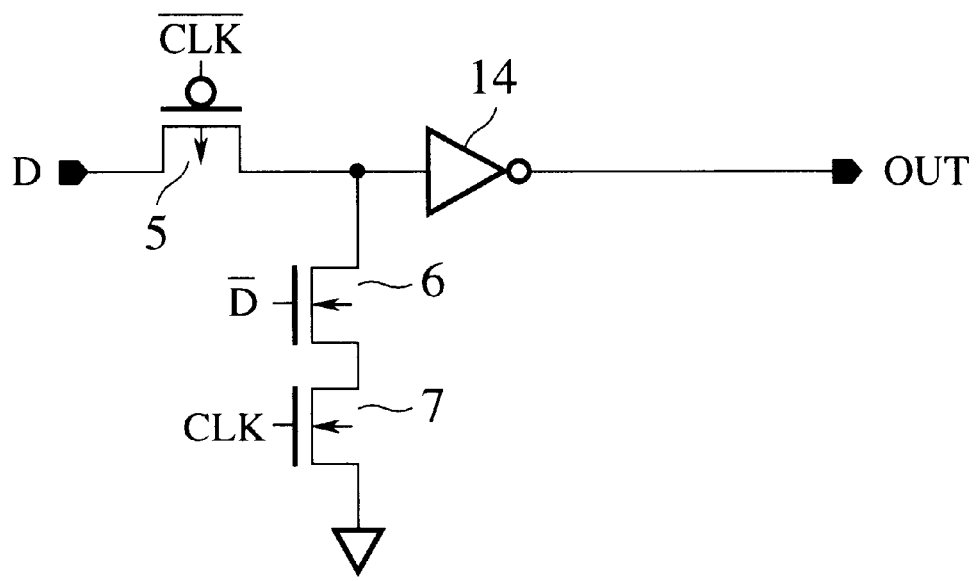
FIG. 6A shows a latch circuit according to a second embodiment of the present invention.

FIG. 6A shows a latch circuit according to the second embodiment of the present invention. The latch circuit has a pMOS transistor 5 and a series-connected circuit consisting of nMOS transistors 6 and 7. The pMOS transistor 5 serves as a first transmission unit and has a gate terminal to receive an inverted clock signal $\overline{CLK}$, a source terminal connected to an input terminal D, and a drain terminal, to control the transmission of input data D from the input terminal D to the drain terminal. The nMOS transistor 6 serves as a third transmission unit and has a gate terminal to receive inverted input data $\overline{D}$, which is an inversion of the input data D, to control the transmission of low level potential from a power supply. The nMOS transistor 7 serves as a second transmission unit and has a gate terminal to receive a clock signal CLK, to control the transmission of the low level potential from the power supply. The latch circuit further has an inverter 14 serving as a buffer circuit. The inverter 14 has an input terminal connected to the drain terminal of the pMOS transistor 5 and an output terminal connected to an output terminal OUT of the latch circuit, to buffer and provide the input data D latched at the drain terminal of the pMOS transistor 5. The nMOS transistors 6 and 7 are connected in series to form the series-connected circuit. The series-connected circuit is arranged between the power supply for providing the low level potential and the drain terminal of the pMOS transistor 5. Contrary to the input data D and $\overline{D}$ of the first embodiment, the input data D and $\overline{D}$ of the second embodiment are complementary signals each involving a rise steeper than a fall. To latch the input data D, the pMOS transistor 5 and nMOS transistors 6 and 7 are sufficient, and the buffer inverter 14 may be omitted.

Latching such complementary signals having a steeper rise and a gentler fall by the latch circuit of FIG. 6A will be explained. When the clock signal CLK is high level, the inverted clock signal $\overline{CLK}$ is low level to make the pMOS transistor 5 conductive and fetch the input data D. If the input data D changes from low to high level and the inverted input data $\overline{D}$ from high to low level, the input data D changes faster than the inverted input data $\overline{D}$. In response to the input data D that changes faster, the drain terminal of the pMOS transistor 5 provides an output voltage of a high level. The nMOS transistor 7 is conductive because the clock signal CLK supplied to the gate terminal thereof is high level. At this time, the nMOS transistor 6 is turned off because the input data $\overline{D}$ supplied to the gate terminal thereof changes to low level. As a result, the low-potential power supply is disconnected from the drain terminal of the pMOS transistor 5. Accordingly, the latch circuit operates only with the input data D that changes faster, to pass the latched data at high speed.

If the input data D changes from high to low level and the input data $\overline{D}$ from low to high level, the source terminal of the pMOS transistor 5 connected to the input terminal D becomes low level. At this time, the drain terminal of the pMOS transistor 5 provides an output voltage equal to the low level potential plus the gate threshold voltage Vth thereof. The nMOS transistor 7 is conductive because the clock signal CLK is high level. The gate terminal of the nMOS transistor 6 receives the input data $\overline{D}$ of high level. A change in the input data $\overline{D}$ is faster than a change in the input data D. Namely, the input data $\overline{D}$ rises faster than the input data D falls. As a result, the nMOS transistor 6 quickly becomes conductive. Hence the drain terminal of the pMOS transistor 5 is connected to the low-potential power supply and is pulled down to the low level potential. Consequently, the latch circuit starts to operate in response to the inverted input data $\overline{D}$ without waiting for the slower change of the input data D, thereby improving the speed of the latching operation. The inverter 14 inverts the input data D and provides the inverted data to the output terminal OUT without regard to the level of the input data D.

If the clock signal CLK is low level, the inverted clock signal $\overline{CLK}$ is high level to turn off the pMOS transistor 5 not to fetch the input data D. At this time, the nMOS transistor 7 is also in nonconductive state. Accordingly, the output terminal OUT dynamically holds the presently latched input data.

In this way, contrary to the first embodiment, the second embodiment is effective to improve a latching speed when the falling time of input data is longer than the rising time thereof.

Figure 6B:
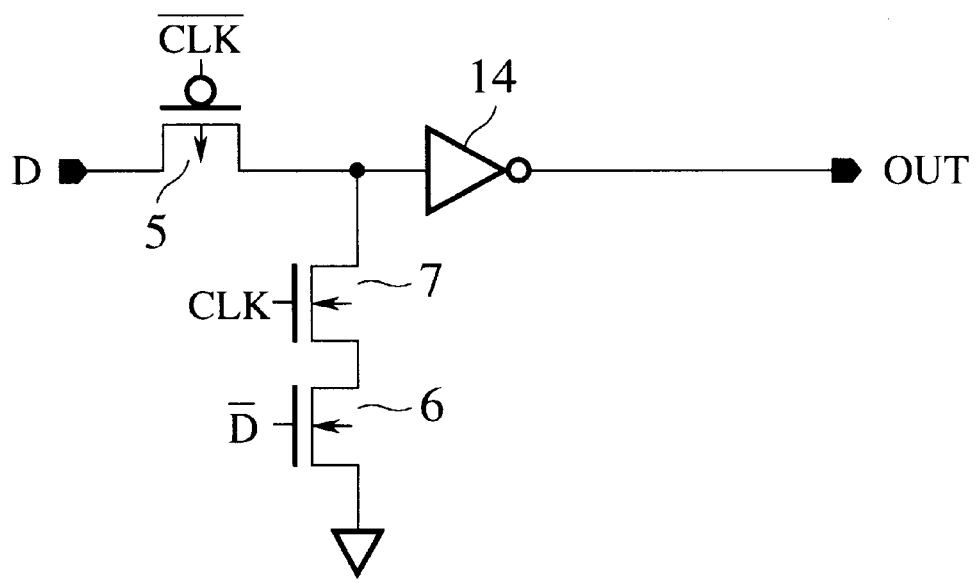
FIG. 6B shows a latch circuit according to a modification of the second embodiment of the present invention.

FIG. 6B shows a modification of the second embodiment, which shows an interchanged order of nMOS transistors 6 and 7 in the series-connected circuit. By changing the order of nMOS transistors 6 and 7, the similar function and effectiveness can be obtained.

Third Embodiment

Figure 7A:
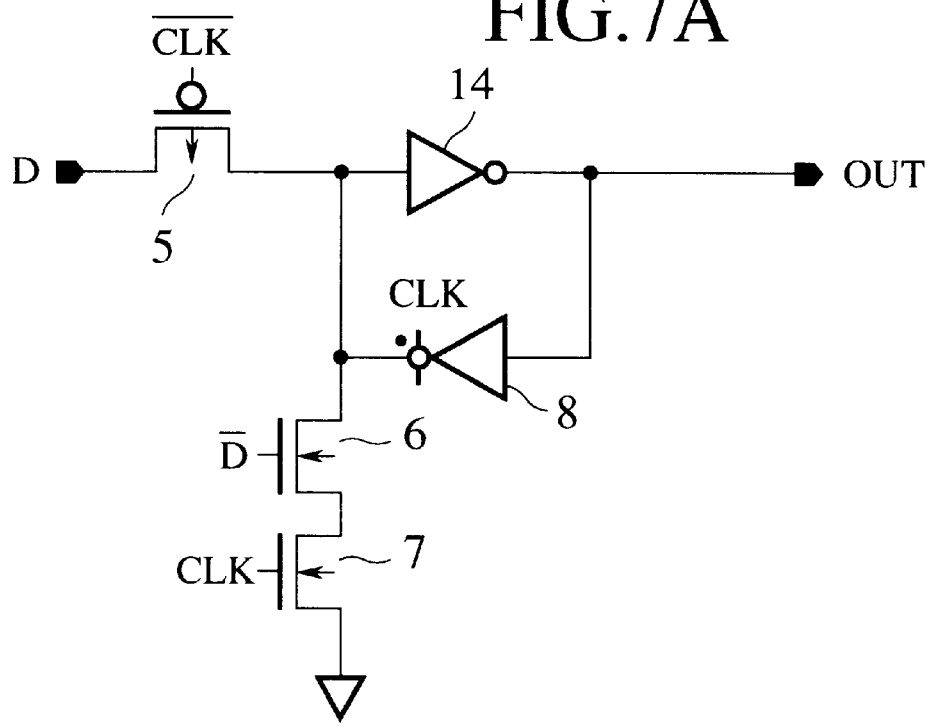
FIG. 7A shows a latch circuit according to a third embodiment of the present invention.

FIG. 7A shows a latch circuit according to the third embodiment of the present invention. Compared with the second embodiment of FIG. 6A, the third embodiment additionally has a clock-controlled inverter 8. The inverter 8 has an input terminal connected to an output terminal OUT of the latch circuit and an output terminal connected to a drain terminal of a pMOS transistor 5. The inverter 8 statically holds input data D latched at the drain terminal of the pMOS transistor 5 in synchronization with a clock signal CLK. The other arrangements of the third embodiment are the same as those of the second embodiment of FIG. 6.

If the clock signal CLK is high level in FIG. 7A, the clock-controlled inverter 8 is in the OFF state not to affect the transmission of data. If the clock signal CLK is low level, the pMOS transistor 5 and an nMOS transistor 7 are in the OFF state, and the inverter 8 is conductive. As a result, output data OUT is statically held by an inverter 14 and the inverter 8. The third embodiment provides not only the effectiveness of the second embodiment of FIG. 6A but also an effectiveness of statically holding latched data, thereby improving the stability of the latching operation.

Figure 7B:
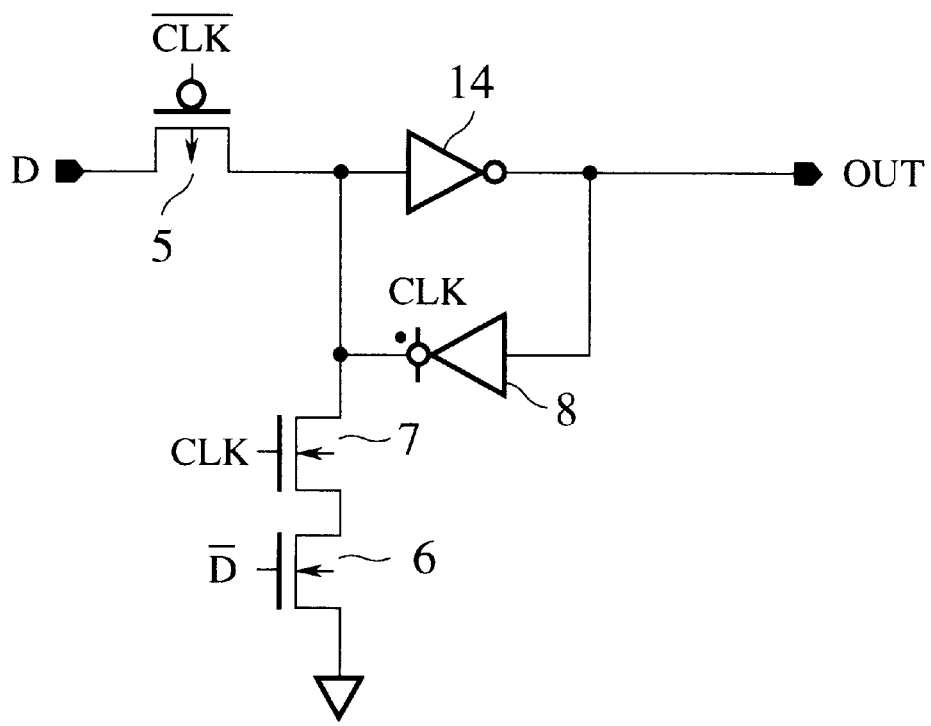
FIG. 7B shows a latch circuit according to a modification of the third embodiment of the present invention.

FIG. 7B shows a modification of the third embodiment, which corresponds to the modification of the second embodiment shown in FIG. 6B. By changing the order of nMOS transistors 6 and 7 in the series-connected circuit, the same function and effectiveness of FIG. 7A are obtained.

Fourth Embodiment

Figure 8A:
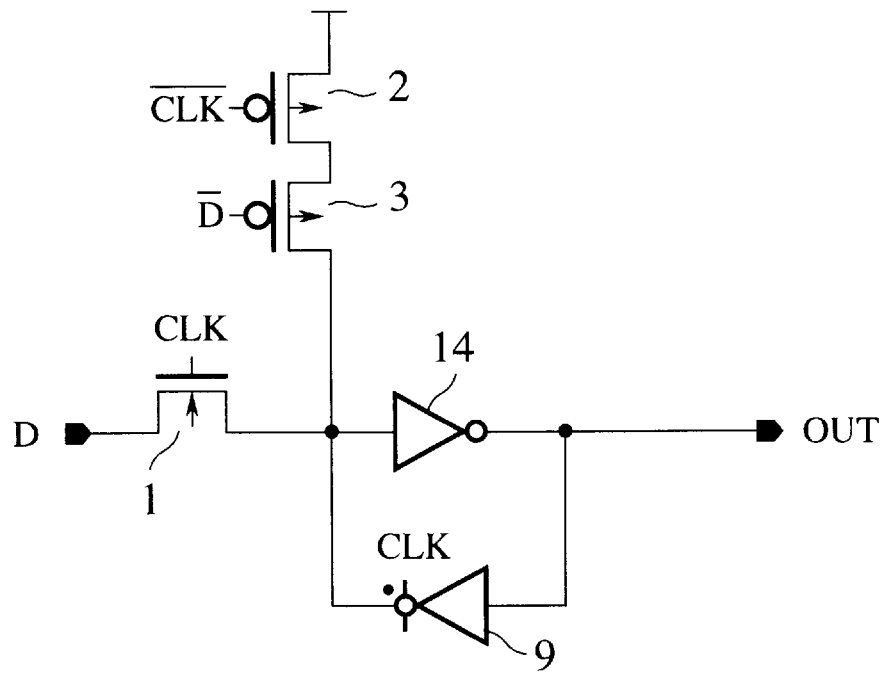
FIG. 8A shows a latch circuit according to a fourth embodiment of the present invention.

FIG. 8A shows a latch circuit according to the fourth embodiment of the present invention. Compared with the first embodiment of FIG. 5A, the fourth embodiment additionally has a clock-controlled inverter 9. The inverter 9 has an input terminal connected to an output terminal OUT of the latch circuit and an output terminal connected to a drain terminal of an nMOS transistor 1. The inverter 9 statically holds input data D latched at the drain terminal of the nMOS transistor 1 in synchronization with a clock signal CLK. The other arrangements of the fourth embodiment are the same as those of the first embodiment of FIG. 5A. If the clock signal CLK is high level in FIG. 8A, the inverter 9 is in the OFF state not to affect the transmission of data. If the clock signal CLK is low level, the inverter 9 is conductive, and the nMOS transistor 1 and a pMOS transistor 2 are nonconductive, so that an inverter 14 and the inverter 9 statically hold output data OUT.

Figure 2:
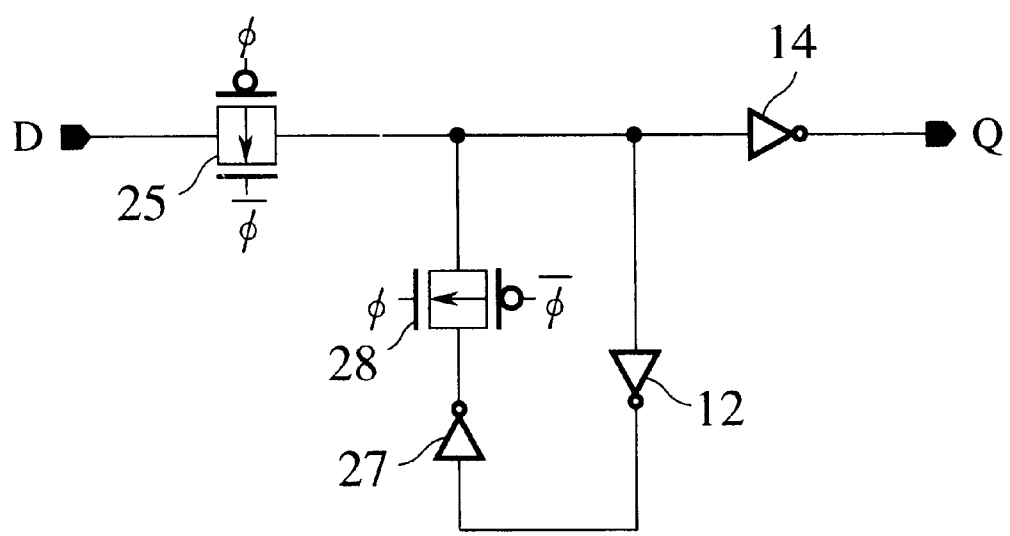
FIG. 2 shows a latch circuit employing CMOS transmission gates according to another prior art.
Figure 3:
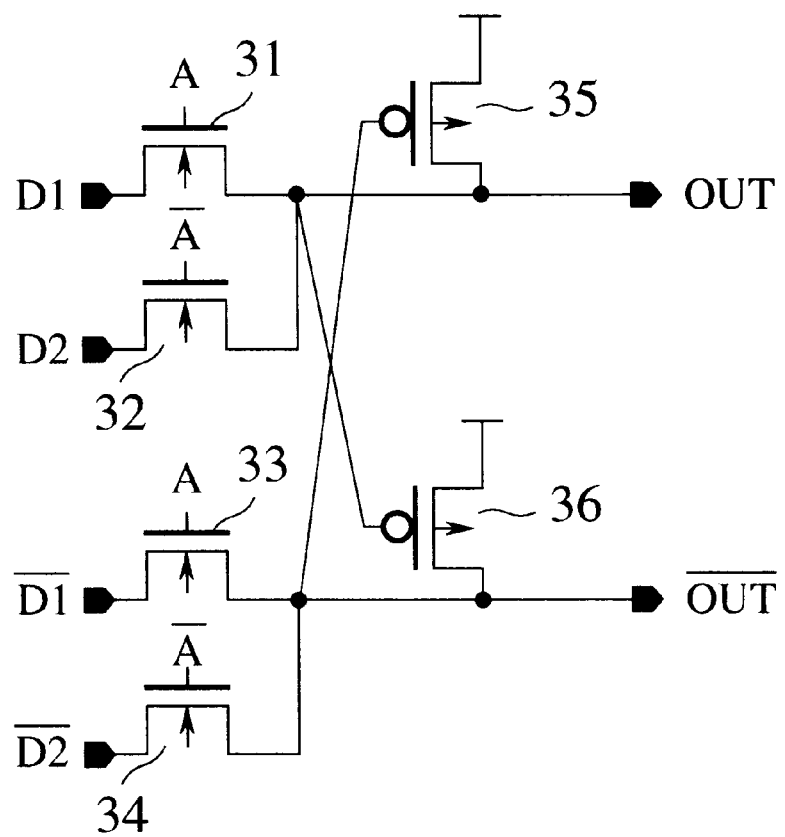
FIG. 3 shows a circuit for supplying input signals to a latch circuit of the present invention.
Figure 8B:
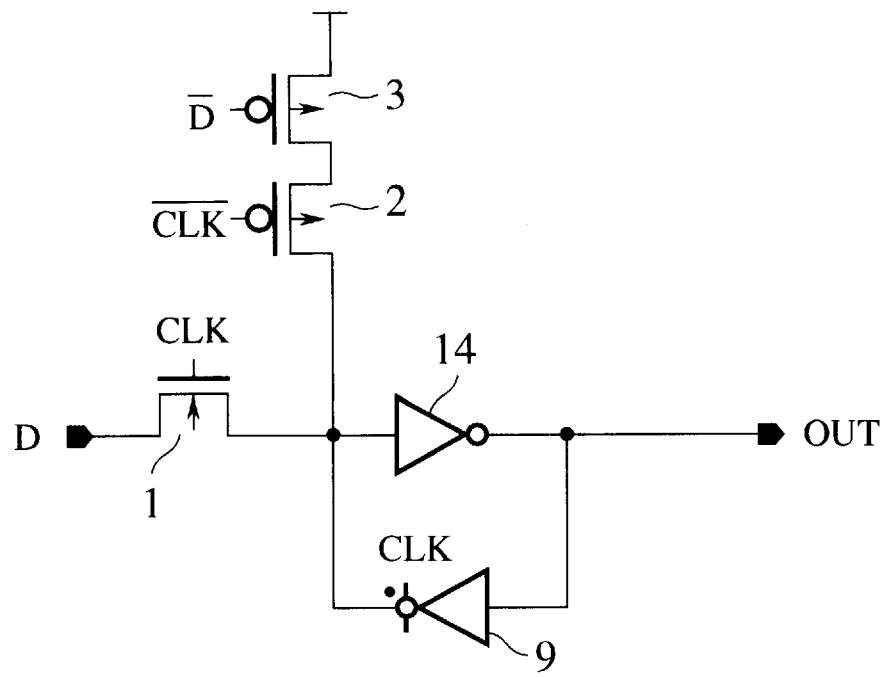
FIG. 8B shows a latch circuit according to a modification of the fourth embodiment of the present invention.

The high-speed performance of the latch circuit of the fourth embodiment will be explained in detail. A combination of any one of the conventional latch circuits of FIGS. 1 and 2 with the selector circuit of FIG. 3 needs 0.88 nsec at the maximum to provide a latched output after the input data D shows a change as shown in FIG. 4. On the other hand, a combination of the latch circuit of the fourth embodiment, which employs the same design rules as the prior art, with the selector circuit of FIG. 3 needs only 0.61 nsec to provide a latched output after the input data D shows a change. Namely, the fourth embodiment improves a latching speed by 0.27 nsec. In this way, the fourth embodiment provides not only the effectiveness of the first embodiment of FIG. 5A but also an effectiveness of statically holding latched data, thereby improving the speed and stability of the latching operation. The same is true for a modification shown in FIG. 8B, which corresponds to FIG. 5B having an inverted order of pMOS transistors 2 and 3 in the series-connected circuit.

Fifth Embodiment

Figure 9A:
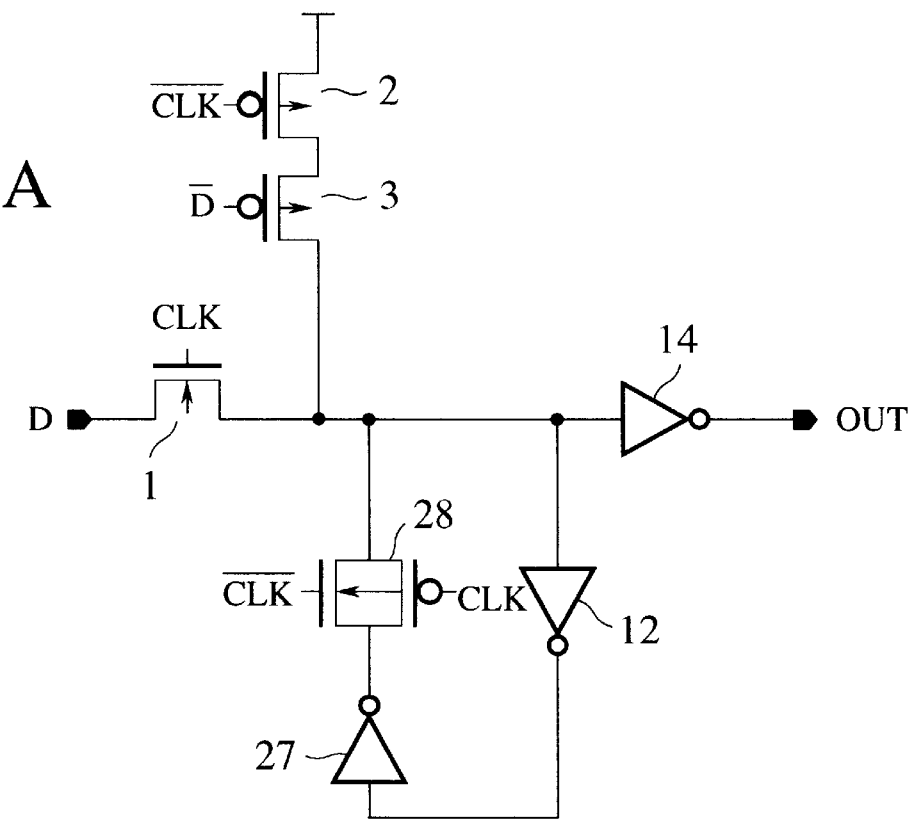
FIG. 9A shows a latch circuit according to a fifth embodiment of the present invention.
Figure 9B:
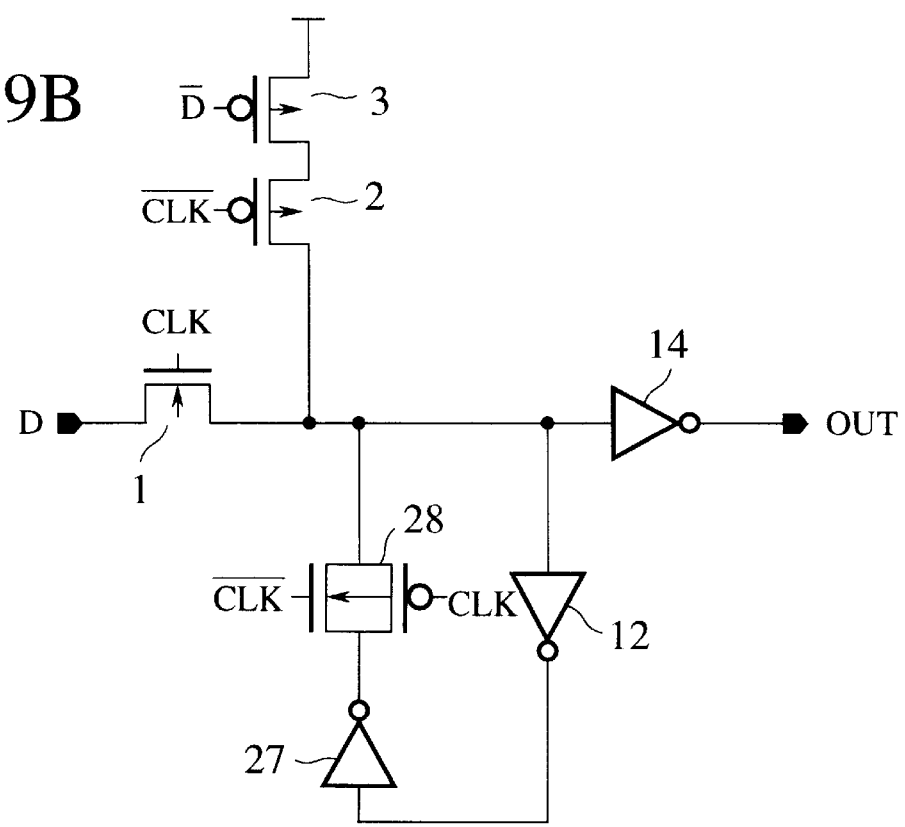
FIG. 9B shows a latch circuit according to a modification of the fifth embodiment of the present invention.

FIG. 9A shows a latch circuit according to the fifth embodiment of the present invention. Compared with the fourth embodiment of FIG. 8A, the fifth embodiment has another holding circuit than that consisting of the clock-controlled inverter 9, to statically hold input data D latched at a drain terminal of an nMOS transistor 1, in synchronization with a clock signal CLK. The holding circuit of the fifth embodiment consists of a first inverter 12, a second inverter 27 and a complementary transmission gate 28. The first inverter 12 has an input terminal connected to the drain terminal of the nMOS transistor 1. The second inverter 27 has an input terminal connected to an output terminal of the first inverter 12. The transmission gate 28 is inserted between the second inverter 27 and the drain terminal of the nMOS transistor 1. The transmission gate 28 is disconnected when the clock signal CLK is high level and becomes conductive when the clock signal CLK is low level. The other arrangements of the fifth embodiment are the same as those of the fourth embodiment of FIG. 8A. The fifth embodiment provides the same effectiveness as the fourth embodiment. And the same function and effectiveness are obtainable for a modification shown in FIG. 9B, in which pMOS transistor 3 is connected to the power supply.

Sixth Embodiment

Figure 10A:
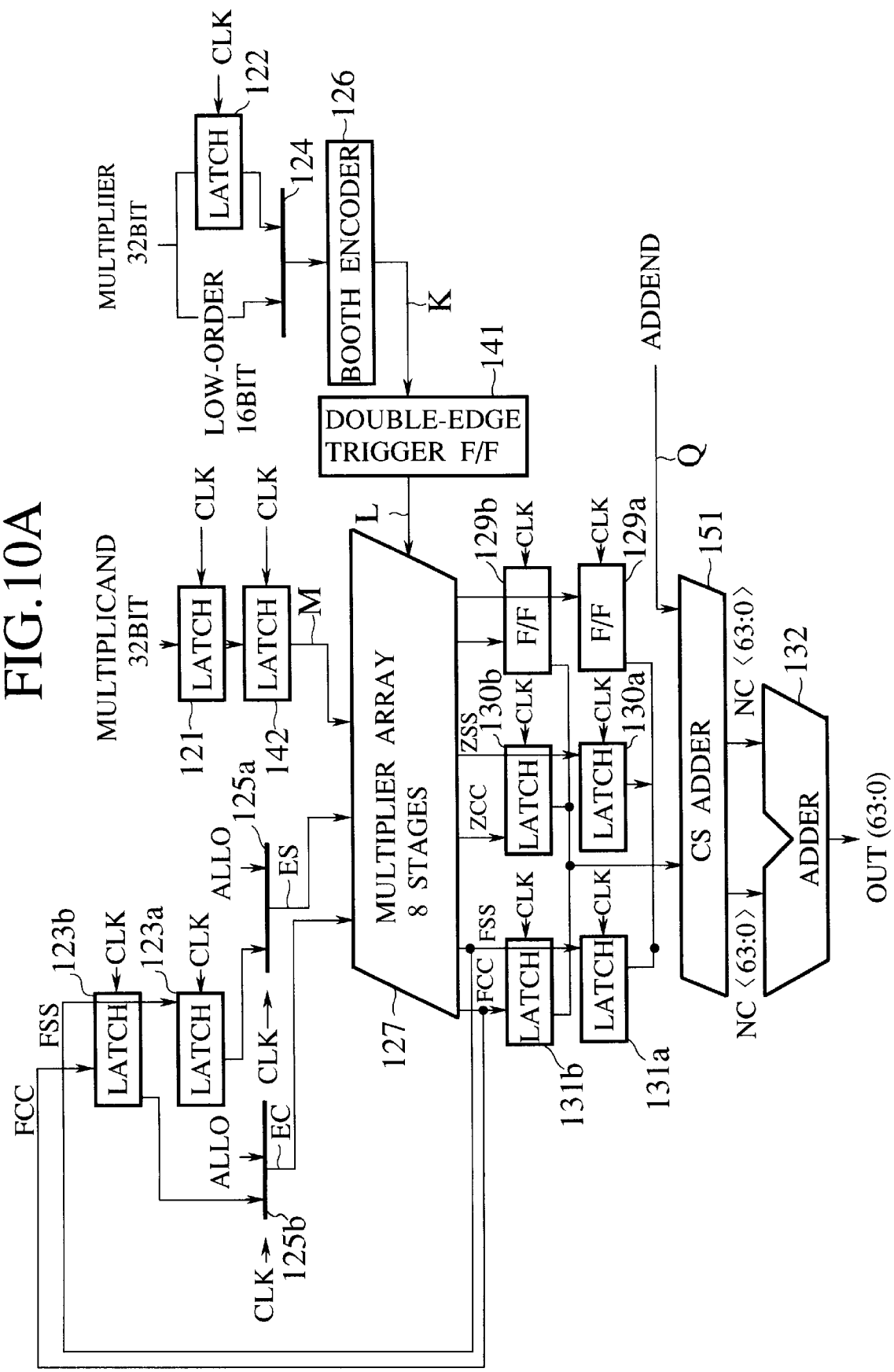
FIG. 10A shows a sum-of-products unit according to a sixth embodiment of the present invention.
Figure 10B:
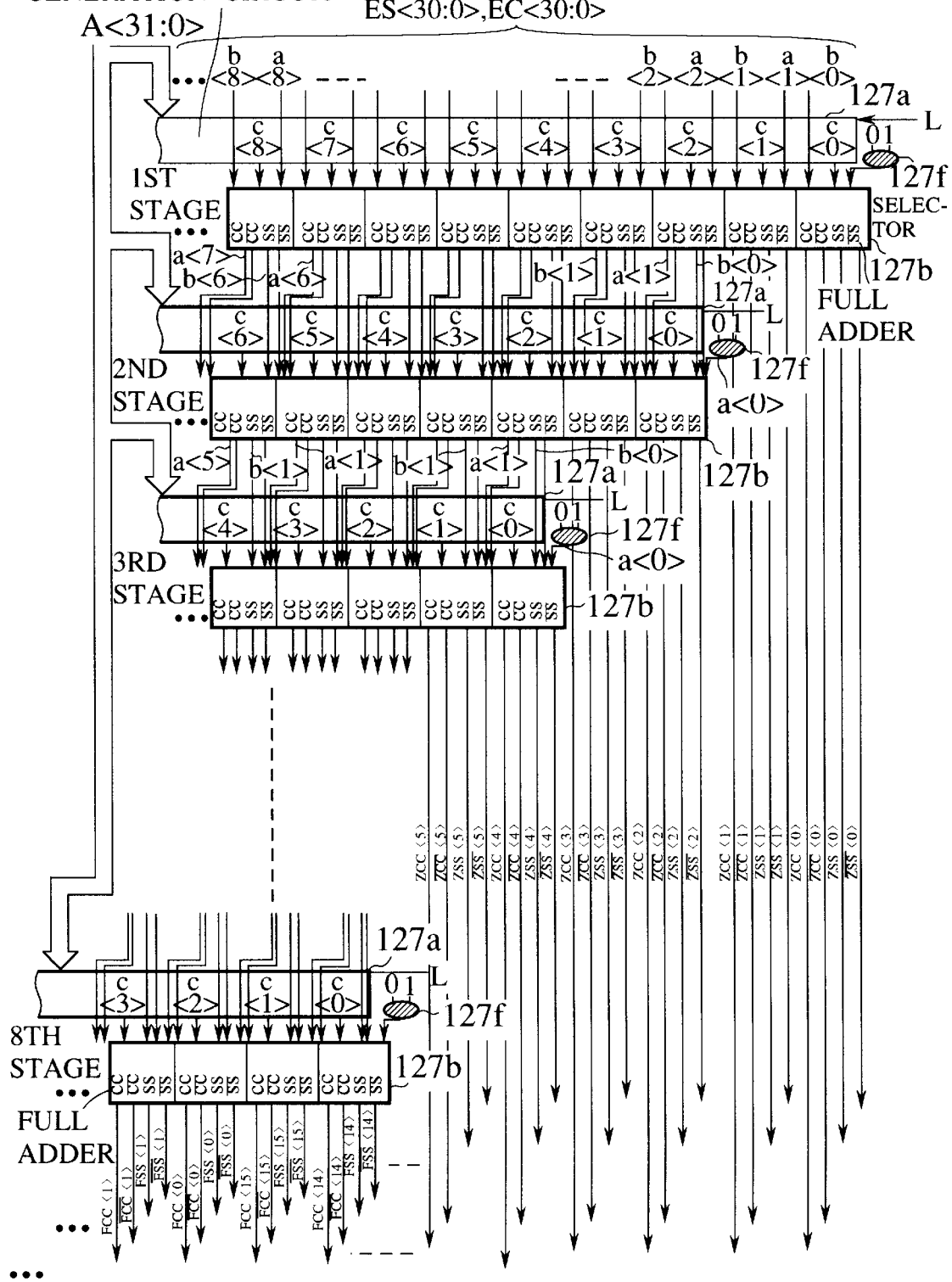
FIG. 10B shows the details of a multiplier array of the sum-of-products unit of FIG. 10A.
Figure 10C:
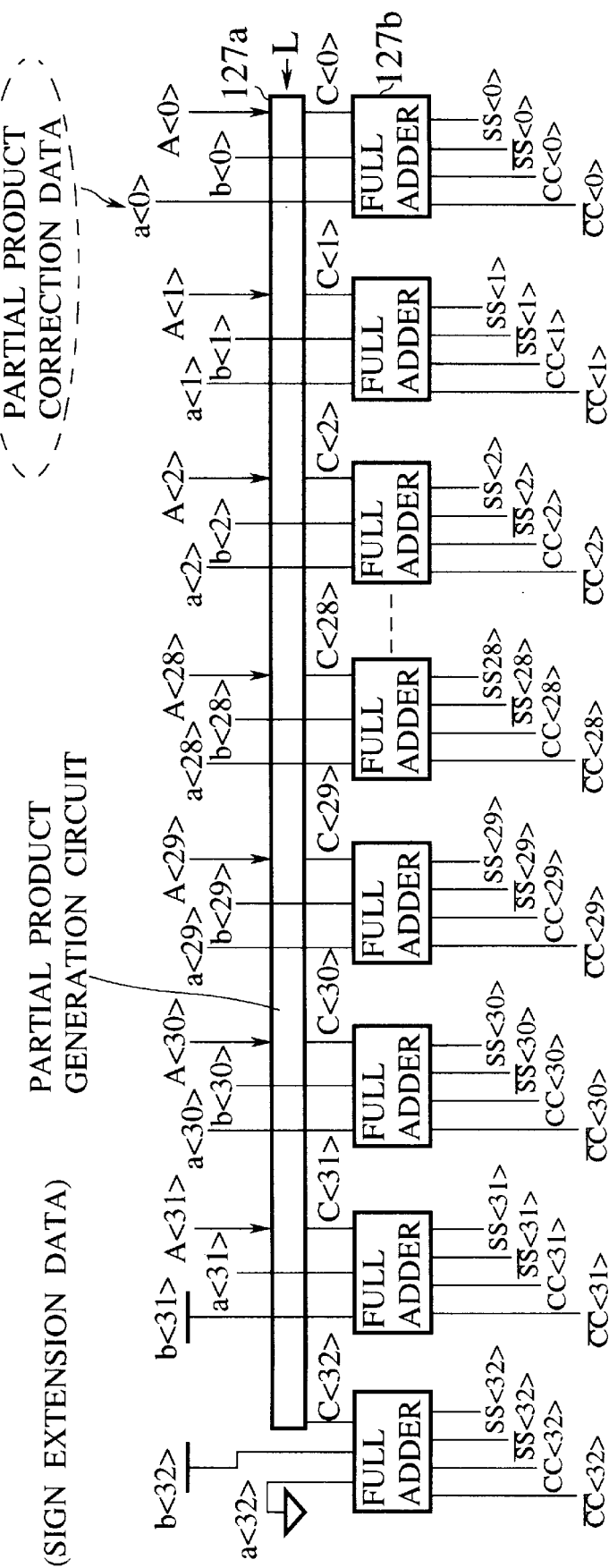
FIG. 10C shows one of stages of the multiplier array of FIG. 10B.
Figure 10D:
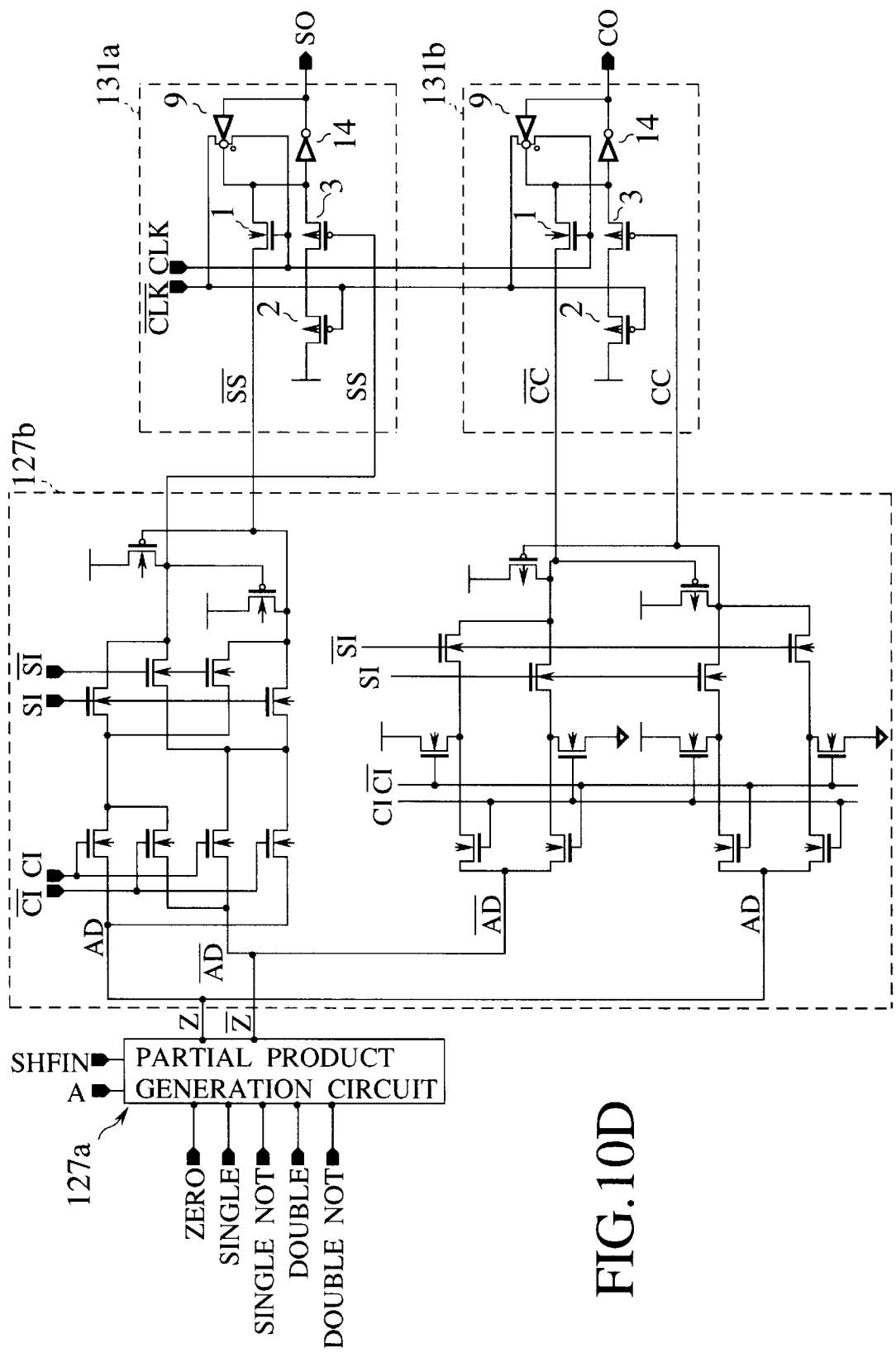
FIG. 10D shows a dual-rail full adder and latch circuits connected thereto for a given output bit of the last stage of the multiplier array of FIG. 10B.

FIG. 10A is a general view showing a sum-of-products unit, and FIGS. 10B to 10D show parts thereof. This unit is capable of carrying out a signed sum-of-products operation of 32 bits×32 bits+64 bits at high speed. A multiplier array 127 is connected to latch circuits 130a, 130b, 131a and 131b, each of which is based on the fourth embodiment of FIG. 8A, and F/Fs 129a and 129b.

The unit of the sixth embodiment is basically composed of multipliers that carry out a signed multiplication of 32 bits×32 bits according to Booth algorithm. The Booth algorithm halves the generation of partial products, to shorten a cumulative addition time.

In FIG. 10A, the multipliers that form the base of the sixth embodiment are connected to 32-bit latch circuits 121 and 142, a 17-bit latch circuit 122, and 62-bit latch circuits 123a and 123b. The latch circuit 121 passes a 32-bit multiplicand if a clock signal CLK is high level and hold the same if the clock signal CLK is low level. The latch circuit 142 passes a 32-bit multiplicand if a clock signal CLK is low level and holds the same if the clock signal CLK is high level. The latch circuit 122 passes high-order 17 bits of a 32-bit multiplier if the clock signal CLK is high level and holds the same if the clock signal CLK is low level. The latch circuit 123a passes intermediate sum data provided by the last stage of the multiplier array 127 if the clock signal CLK is low level and holds the same if the clock signal CLK is high level. And the latch circuit 123b passes intermediate carry data provided by the last stage of the multiplier array 127.

The output side of the latch circuit 122 is connected to a selector 124 that selects low-order 16 bits+"0" of a multiplier or the output of the latch circuit 122 according to the level of the clock signal CLK. The output side of the latch circuit 123a is connected to a selector 125a that selects 62 bits of each 0 (initial value) or the output of the latch circuit 123a according to the level of the clock signal CLK. The output side of the latch circuit 123b is connected to a selector 125b that selects 62 bits of each 0 (initial value) or the output of the latch circuit 123b according to the level of the clock signal CLK.

A Booth encoder 126 is arranged on the output side of the selector 124 and is connected to the eight-stage multiplier array 127 through a double edge trigger flip-flop (F/F) 141. The multiplier array 127 is also connected to the latch circuit 142 and selector 125. The Booth encoder 126 employs a second-order Booth algorithm to encode 17-bit input data and generates a control signal K used to produce partial products. The double edge trigger F/F 141 is inserted between the Booth encoder 126 and the multiplier array 127. Although this arrangement increases an operation time by a half cycle, it equalizes the period of each half-cycle processing, thereby enabling the use of a higher frequency clock signal. The double edge trigger F/F 141 provides an output of L<39:0> and the latch circuit 142 provides an output of M<31:0>. These outputs are supplied to the multiplier array 127.

Each stage of the multiplier array 127 consists of a partial product generation circuit 127a and a cumulative addition circuit, as shown in FIGS. 10B and 10C. The partial product generation circuit 127a generates products of a multiplicand times 0, 1, and 2, the multiplicand times −1 minus 1, and the multiplicand times −2 minus 1, one of which is selected according to a control signal L provided by the double edge trigger F/F 141. The cumulative addition circuit consists of full adders (33 bits) 127b that receive the outputs of the partial product generation circuit 127a, partial product correction data of the preceding cumulative addition result times −1, and partial product correction data of the preceding cumulative addition result times −2. Each of the full adders 127b provides complementary sum outputs SS and $\overline{SS}$ and complementary carry outputs CC and $\overline{CC}$. The latch circuit 131a receives the sum outputs FSS and $\overline{FSS}$ and the latch circuit 131b receives the carry outputs FCC and $\overline{FCC}$ from the eighth stage full adder 127b and provide a sum output SO and a carry output CO, respectively. The latch circuit 130a receives the sum outputs ZSS and $\overline{ZSS}$ and the latch circuit 130b receives the carry outputs ZCC and $\overline{ZCC}$ and provide a sum output SO and a carry output CO, respectively. On the output side of the latch circuits 130a, 130b, 131a and 131b and F/F 129a and 129b, there is arranged a carry save adder 151, and on the output side of the carry save adder 151, there is arranged a carry propagation adder (CPA) 132 for adding carry-saved sum-of-products results to each other.

The carry save adder 151 receives the output of the F/F 129a and 129b, the outputs of the latch circuits 130a, 130b, 131a and 131b, and addend Q<63:0>, and provides a carry signal NC<63:0> and a sum NS<63:0>. These outputs NC<63:0> and NS<63:0> are added to each other by the CPA 132, which provides a sum OUT<63:0>.

FIG. 10D shows a dual rail circuit involving the full adder 127b and the latch circuits 131a and 131b for a one-bit output of the partial product generation circuit 127a of the last stage (eighth stage) of the multiplier array 127. The partial product generation circuit 127a of the last stage provides complementary signals AD and $\overline{AD}$. The full adder 127b receives three sets of complementary inputs AD, $\overline{AD}$, SI, $\overline{SI}$, CI, and $\overline{CI}$ and provides the latch circuits 131a and 131b with complementary sum outputs SS and $\overline{SS}$ and complementary carry outputs CC and $\overline{CC}$.

The latch circuit 131a of FIG. 10D has an nMOS transistor 1 and a series-connected circuit consisting of pMOS transistors 2 and 3. The nMOS transistor 1 serves as a first transmission unit and has a gate terminal to receive a clock signal CLK, a source terminal to receive the input data $\overline{SS}$, and a drain terminal, to control the transmission of the input data $\overline{SS}$ to the drain terminal. The pMOS transistor 2 serves as a second transmission unit and has a gate terminal to receive an inverted clock signal $\overline{CLK}$, to control the transmission of a predetermined high level potential from a power supply. The pMOS transistor 3 serves as a third transmission unit and has a gate terminal to receive the input data SS, which is an inversion of the input data $\overline{SS}$, to control the transmission of the high level potential from the power supply. The latch circuit 131a further has an inverter 14 and a clock-controlled inverter 9. The inverter 14 has an input terminal connected to the drain terminal of the nMOS transistor 1 and an output terminal connected to an output terminal of the latch circuit, to buffer and provide the input data $\overline{SS}$ latched at the drain terminal of the nMOS transistor 1. The clock-controlled inverter 9 has an input terminal connected to the output terminal of the latch circuit and an output terminal connected to the drain terminal of the nMOS transistor 1. The clock-controlled inverter 9 statically holds the input data $\overline{SS}$ latched at the drain terminal of the nMOS transistor 1 in synchronization with the clock signal CLK. Similarly, the latch circuit 131 consists of an nMOS transistor 1, a series-connected circuit consisting of pMOS transistors 2 and 3, an inverter 14, and a clock-controlled inverter 9, to statically hold the input data $\overline{CC}$ latched at the drain terminal of the nMOS transistor 1 in synchronization with the clock signal CLK.

If the clock signal CLK is high level in FIG. 10D, the clock-controlled inverters 9 are in the OFF state not to affect the transmission of data. If the clock signal CLK is low level, the clock-controlled inverters 9 are conductive, and the nMOS transistors 1 and pMOS transistors 2 are in the OFF state. As a result, outputs SO and CO latched at the drain terminals of the nMOS transistors 1 are statically held by the inverters 14 and 9. If the clock signal CLK is high level, the nMOS transistors 1 become conductive to fetch the input data $\overline{SS}$ and $\overline{CC}$. If the input data $\overline{SS}$ changes from high to low level and the input data SS from low to high level under this state and if the input data $\overline{SS}$ falls quicker than the input data SS rises, the drain of the nMOS transistor 1 in the latch circuit 131a quickly becomes low level in response to the fall of the input data $\overline{SS}$. Similarly, the input data $\overline{CC}$ changes from high to low level and the input data CC from low to high level under this state and if the input data $\overline{CC}$ falls quicker than the input data CC rises, the drain of the nMOS transistor 1 in the latch circuit 131b quickly becomes low level in response to the fall of the input data $\overline{CC}$. The pMOS transistors 2 are conductive because the inverted clock signal CLK to the gate terminals thereof is low level. On the other hand, the pMOS transistors 3 are in the OFF state because the input data SS and CC to the gate terminals thereof are high level, to disconnect the high-potential power supply from the drain terminals of the nMOS transistors 1. As a result, the latch circuits 131a and 131b operate in response to only the input data that change faster, to pass the data at high speed. On the other hand, if the input data $\overline{SS}$ and $\overline{CC}$ change from low to high level and the input data SS and CC from high to low level, the drain terminals of the nMOS transistors 1 provide an output voltage equal to the high level minus the gate threshold voltage Vth thereof even if the source terminals of the nMOS transistors 1 receive the high level data. However, the pMOS transistors 2 are conductive, and the input data $\overline{SS}$ and $\overline{CC}$ supplied to the gate terminals of the pMOS transistors 3 change to low level quicker than the input data $\overline{SS}$ and $\overline{CC}$ change to high level. As a result, the pMOS transistors 3 become conductive, to connect the drain terminals of the nMOS transistors 1 to the high-potential power supply, to make the drain terminals of the nMOS transistors 1 high level. In this case, the latch circuits 131a and 131b start to operate in response to the input data SS and CC that change quickly without waiting for a delayed change in the input data $\overline{SS}$ and $\overline{CC}$, thereby improving the data passing speed of the latch circuits 131a and 131b. Similarly, the latch circuits 130a and 130b start to operate in response to the input data SS and CC that change quickly without waiting for a delayed change in the input data $\overline{SS}$ and $\overline{CC}$, thereby improving the data passing speed of the latch circuits 130a and 130b.

In this way, even if the complementary outputs SS, $\overline{SS}$, CC, and $\overline{CC}$ of the multiplier array 127 involve different rising and falling characteristics, the latch circuits 130a, 130b, 131a and 131b of the sixth embodiment latch the data at high speed. Generally, a sum-of-products operation involves addition operations after multipliers provide multiplication results. The sixth embodiment once adds carry-saved multiplication results provided by the latch circuits 130a, 130b, 131a and 131b and F/F 129a and 129b to sum-of-products data in the carry save adder 151 and adds results provided by the carry save adder 151 to one another in the CPA 132, thereby shortening the addition time of the sum-of-product operation. The sixth embodiment is also capable of latching the outputs of the multiplier array at high speed, to improve the speed of sum-of-products operations and reduce circuit scale.

Various modifications will become possible for those skilled in the art after receiving the teachings of the present disclosure without departing from the scope thereof. For example, the holding circuit of FIG. 9A is applicable to the latch circuit of FIG. 6A. As explained above, the present invention provides a latch circuit that speedily latches complementary signals having different rising time and falling time in response to a rise or a fall of one of the signals that changes faster than the other. This latch circuit is applicable to dual-rail arithmetic units, to improve the operation speed thereof.

What is claimed is:

1. A latch circuit comprising:
   (a) a first transmission unit for controlling the transmission of a first input signal in synchronization with a first control signal, the first input signal having rising time and falling time that differ from each other; and
   (b) a series-connected circuit arranged between a power supply having a predetermined potential and output terminal of the first transmission unit, the series-connected circuit including:
      a second transmission unit for controlling the transmission of the predetermined potential in synchronization with a second control signal, wherein the second transmission unit operates complementarily to the first transmission unit according to the second control signal which is an inversion of the first control signal; and
      a third transmission unit connected to the second transmission unit in series for controlling the transmission of the predetermined potential in synchronization with a second input signal that rises and falls oppositely to the first input signal and has rising and falling times that differ from each other;
      the first input signal being latched at the output terminal of the first transmission unit.

2. The latch circuit of claim 1, wherein the first control signal is a clock signal, and the second control signal is an inverted clock signal.

3. The latch circuit of claim 1, wherein the first input signal being latched at the output terminal of the first transmission unit by using a holding circuit connected to the output terminal of the first transmission unit, for statically latching the first input signal.

4. The latch circuit of claim 1, further comprising a buffer circuit connected to the output terminal of the first transmission unit, for buffering and outputting the first input signal.

5. The latch circuit of claim 3, further comprising a buffer circuit connected to the output terminal of the first transmission unit, for buffering and outputting the first input signal.

6. A latch circuit comprising:
   (a) a first transmission unit for controlling the transmission of a first input signal in synchronization with a first control signal; and
   (b) a series-connected circuit arranged between a power supply having a predetermined potential and output terminal of the first transmission unit, the series-connected circuit having a second transmission unit for controlling the transmission of the predetermined potential in synchronization with a second control signal and a third transmission unit connected to the second transmission unit in series for controlling the transmission of the predetermined potential in synchronization with a second input signal that rises and falls oppositely to the first input signal and has rising time and falling time that differ from each other,
   the first input signal being latched at the output terminal of the first transmission unit,
   wherein the first control signal is a clock signal, and the second control signal is an inverted clock signal that is an inversion of the clock signal.

7. The latch circuit of claim 6, wherein the first input signal being latched at the output terminal of the first transmission unit by using a holding circuit connected to the output terminal of the first transmission unit, for statically holding the first input signal.

8. The latch circuit of claim 6, further comprising a buffer circuit connected to the output terminal of the first transmission unit, for buffering and outputting the first input signal.

9. The latch circuit of claim 7, further comprising a buffer circuit connected to the output terminal of the first transmission unit, for buffering and outputting the first input signal.

10. A latch circuit comprising:
    (a) a first transmission unit for controlling the transmission of a first input signal in synchronization with a first control signal;
    (b) a series-connected circuit arranged between a power supply having a predetermined potential and output terminal of the first transmission unit, the series-connected circuit having a second transmission unit for controlling the transmission of the predetermined potential in synchronization with a second control signal and a third transmission unit connected to the second transmission unit in series for controlling the transmission of the predetermined potential in synchronization with a second input signal that rises and falls oppositely to the first input signal and has rising time and falling time that differ from each other; and
    (c) a holding circuit connected to the output terminal of the first transmission unit, for statically latching the first input signal,
    the first input signal being latched at the output terminal of the first transmission unit.

11. The latch circuit of claim 10, further comprising a buffer circuit connected to the output terminal of the first transmission unit, for buffering and outputting the first input signal.

12. A latch circuit comprising:
    (a) a first transmission unit for controlling the transmission of a first input signal in synchronization with a first control signal;
    (b) a series-connected circuit arranged between a power supply having a predetermined potential and output terminal of the first transmission unit, the series-connected circuit having a second transmission unit for controlling the transmission of the predetermined potential in synchronization with a second control signal and a third transmission unit connected to the second transmission unit in series for controlling the transmission of the predetermined potential in synchronization with a second input signal that rises and falls oppositely to the first input signal and has rising time and falling time that differ from each other; and (c) a buffer circuit connected to the output terminal of the first transmission unit, for buffering and outputting the first input signal,
    the first input signal being latched at the output terminal of the first transmission unit.

13. A latch circuit comprising:
    (a) a first FET (Field Effect Transistor) of first conductivity type, having a source terminal to receive a first input signal and a gate terminal to receive a clock signal, for controlling the transmission of the first input signal in synchronization with the clock signal, the first input signal having rising time and falling time that differ from each other; and (b) a series-connected circuit arranged between a power supply having a predetermined potential and a drain terminal of the first FET, the series-connected circuit having a second FET of second conductivity type opposite to the first conductivity type for controlling the transmission of the predetermined potential in synchronization with an inverted clock signal that is an inversion of the clock signal and a third FET of the second conductivity type connected to the second FET in series, for controlling the transmission of the predetermined potential in synchronization with a second input signal that rises and falls oppositely to the first input signal and has rising time and falling time that differ from each other, the first input signal being latched at the drain terminal of the first FET.

14. A latch circuit comprising:

(a) a first FET (Field Effect Transistor) of first conductivity type, having a source terminal to receive a first input signal and a gate terminal to receive a clock signals, for controlling the transmission of the first input signal in synchronization with the clock signal;

(b) a series-connected circuit arranged between a power supply having a predetermined potential and a drain terminal of the first FET, the series-connected circuit having a second FET of second conductivity type for controlling the transmission of the predetermined potential in synchronization with an inverted clock signal that is an inversion of the clock signal and a third FET of the second conductivity type connected to the second FET in series, for controlling the transmission of the predetermined potential in synchronization with a second input signal that rises and falls oppositely to the first input signal and has rising time and falling time that differ from each other; and (c) a holding circuit connected to the drain terminal of the first FET, for statically latching the first input signal, the first input signal being latched at the drain terminal of the first FET.

15. The latch circuit of claim 14, wherein the holding circuit comprises:

an inverter having an input terminal connected to the drain terminal of the first FET; and a clock-controlled inverter having an input terminal connected to an output terminal of the inverter and an output terminal connected to the drain terminal of the first FET, for statically latching the first input signal in synchronization with the clock signal.

16. The latch circuit of claim 14, wherein the holding circuit comprises:

a first inverter having an input terminal connected to the drain terminal of the first FET;

a second inverter connected to an output terminal of the first inverter; and a transmission gate having an input terminal connected to an output terminal of the second inverter and an output terminal connected to the drain terminal of the first FET, for statically latching the first input signal in synchronization with the clock signal.

17. The latch circuit of claim 14, further comprising a buffer circuit connected to the drain terminal of the first FET, for buffering and outputting the first input signal.

18. The latch circuit of claim 15, wherein the first FET of the first conductivity type is an n-channel MOS transistor, and the second and third FETs of the second conductivity type are each a p-channel MOS transistor.

19. The latch circuit of claim 15, wherein the first FET of the first conductivity type is a p-channel MOS transistor, and the second and third FETs of the second conductivity type are each an n-channel MOS transistor.

20. A latch circuit comprising:

(a) a first FET (Field Effect Transistor) of first conductivity type, having a source terminal to receive a first input signal and a gate terminal to receive a clock signal, for controlling the transmission of the first input signal in synchronization with the clock signal;

(b) a series-connected circuit arranged between a power supply having a predetermined potential and a drain terminal of the first FET, the series-connected circuit having a second FET of second conductivity type for controlling the transmission of the predetermined potential in synchronization with an inverted clock signal that is an inversion of the clock signal and a third FET of the second conductivity type connected to the second FET in series, for controlling the transmission of the predetermined potential in synchronization with a second input signal that rises and falls oppositely to the first input signal and has rising time and falling time that differ from each other; and (c) a buffer circuit connected to the drain terminal of the first FET, for buffering and outputting the first input signal, the first input signal being latched at the drain terminal of the first FET.

21. A latch circuit comprising:

(a) an n-channel MOS transistor, having a source terminal to receive a first input signal and a gate terminal to receive a clock signal, for controlling the transmission of the first input signal in synchronization with the clock signal, the first input signal having rising time and falling time that differ from each other; and (b) a series-connected circuit arranged between a power supply having a predetermined potential and a drain terminal of the n-channel MOS transistor, the series-connected circuit having a first p-channel MOS transistor for controlling the transmission of the predetermined potential in synchronization with an inverted clock signal that is an inversion of the clock signal and a second p-channel MOS transistor connected to the first p-channel MOS transistor in series, for controlling the transmission of the predetermined potential in synchronization with a second input signal that rises and falls oppositely to the first input signal and has rising time and falling time that differ from each other, the first input signal being latched at the drain terminal of the n-channel MOS transistor.

22. A latch circuit comprising:

(a) a p-channel MOS transistor, having a source terminal to receive a first input signal and a gate terminal to receive a clock signal, for controlling the transmission of the first input signal in synchronization with the clock signal; and (b) a series-connected circuit arranged between a power supply having a predetermined potential and a drain terminal of the p-channel MOS transistor, the series-connected circuit having a first n-channel MOS transistor for controlling the transmission of the predetermined potential in synchronization with an inverted clock signal that is an inversion of the clock signal and a second n-channel MOS transistor connected to the first n-channel MOS transistor in series, for controlling the transmission of the predetermined potential in synchronization with a second input signal that rises and falls oppositely to the first input signal and has rising time and falling time that differ from each other, the first input signal being latched at the drain terminal of the p-channel MOS transistor.

23. An arithmetic unit having a latch circuit comprising:
(a) a first transmission unit for controlling the transmission of a first input signal in synchronization with a first control signal, the first input signal having rising time and falling time that differ from each other; and
(b) a series-connected circuit arranged between a power supply having a predetermined potential and an output terminal of the first transmission unit, the series-connected circuit including:

second transmission unit for controlling the transmission of the predetermined potential in synchronization with a second control signal, wherein the second transmission unit operates complementarily to the first transmission unit according to the second control signal which is an inversion of the first control signal; and a third transmission unit connected to the second transmission unit in series for controlling the transmission of the predetermined potential in synchronization with a second input signal that rises and falls oppositely to the first input signal and has rising time and falling time that differ from each other, the first input signal being latched at the output terminal of the first transmission unit.

* * * * *